US009105610B2

(12) United States Patent
Sutardja

(10) Patent No.: US 9,105,610 B2
(45) Date of Patent: Aug. 11, 2015

(54) METHODS AND ARRANGEMENTS RELATING TO SEMICONDUCTOR PACKAGES INCLUDING MULTI-MEMORY DIES

(71) Applicant: Marvell World Trade LTD., St. Michael (BB)

(72) Inventor: Sehat Sutardja, Los Altos Hills, CA (US)

(73) Assignee: Marvell World Trade Ltd, St. Michael (BB)

( * ) Notice: Subject to any disclaimer, the term of this patent is extended or adjusted under 35 U.S.C. 154(b) by 0 days.

(21) Appl. No.: 14/218,631

(22) Filed: Mar. 18, 2014

(65) Prior Publication Data

US 2014/0206141 A1 Jul. 24, 2014

Related U.S. Application Data

(62) Division of application No. 13/532,444, filed on Jun. 25, 2012, now Pat. No. 8,674,483.

(60) Provisional application No. 61/642,364, filed on May 3, 2012, provisional application No. 61/501,672, filed on Jun. 27, 2011.

(51) Int. Cl.
  *H01L 21/00* (2006.01)
  *H01L 23/00* (2006.01)
  (Continued)

(52) U.S. Cl.
  CPC ............ *H01L 24/43* (2013.01); *H01L 25/0652* (2013.01); *H01L 25/105* (2013.01); *H01L 25/16* (2013.01); *H01L 25/50* (2013.01); *H01L 23/3128* (2013.01); *H01L 24/05* (2013.01); *H01L 24/06* (2013.01); *H01L 24/13* (2013.01); *H01L 24/14* (2013.01); *H01L 24/16* (2013.01); *H01L 24/29* (2013.01); *H01L 24/32* (2013.01); *H01L 24/48* (2013.01); *H01L 24/49* (2013.01); *H01L 24/73* (2013.01); *H01L 25/18* (2013.01); *H01L 2224/02379* (2013.01);
  (Continued)

(58) Field of Classification Search
  CPC ...................................................... H01L 24/43
  USPC ................................... 257/621; 438/118, 113
  See application file for complete search history.

(56) References Cited

U.S. PATENT DOCUMENTS 8,704,379 B2 4/2014 Crane et al.
2003/0015792 A1 1/2003 Urakawa
(Continued)

FOREIGN PATENT DOCUMENTS

EP 1401020 A1 3/2004

OTHER PUBLICATIONS

Copy of the PCT Search Report mailed Sep. 27, 2012 for PCT application No. PCT/US12/44159, 9 pages.

*Primary Examiner* — Anthony Ho

(57) ABSTRACT

Embodiments provide a method comprising providing a multi-memory die that comprises multiple individual memory dies. Each of the individual memory dies is defined as an individual memory die within a wafer of semiconductor material during production of memory dies. The multi-memory die is created by singulating the wafer of semiconductor material into memory dies where at least one of the memory dies is a multi-memory die that includes multiple individual memory dies that are still physically connected together. The method further comprises coupling a semiconductor die to the multi-memory die.

20 Claims, 16 Drawing Sheets

(51) Int. Cl.
    *H01L 25/065*  (2006.01)
    *H01L 25/10*   (2006.01)
    *H01L 25/00*   (2006.01)
    *H01L 25/16*   (2006.01)
    *H01L 23/31*       (2006.01)
    *H01L 25/18*       (2006.01)

(52) U.S. Cl.
    CPC ............ *H01L 2224/0401* (2013.01); *H01L 2224/04042* (2013.01); *H01L 2224/0557* (2013.01); *H01L 2224/06156* (2013.01); *H01L 2224/131* (2013.01); *H01L 2224/1403* (2013.01); *H01L 2224/14181* (2013.01); *H01L 2224/16145* (2013.01); *H01L 2224/16225* (2013.01); *H01L 2224/16227* (2013.01); *H01L 2224/16235* (2013.01); *H01L 2224/2919* (2013.01); *H01L 2224/32145* (2013.01); *H01L 2224/32225* (2013.01); *H01L 2224/4824* (2013.01); *H01L 2224/48145* (2013.01); *H01L 2224/48227* (2013.01); *H01L 2224/49175* (2013.01); *H01L 2224/73204* (2013.01); *H01L 2224/73207* (2013.01); *H01L 2224/73215* (2013.01); *H01L 2224/73265* (2013.01); *H01L 2225/0651* (2013.01); *H01L 2225/06506* (2013.01); *H01L 2225/06513* (2013.01); *H01L 2225/06517* (2013.01); *H01L 2225/06541* (2013.01); *H01L 2225/06548* (2013.01); *H01L 2225/06562* (2013.01); *H01L 2225/06589* (2013.01); *H01L 2225/1052* (2013.01); *H01L 2225/1058* (2013.01); *H01L 2924/00014* (2013.01); *H01L 2924/1434* (2013.01); *H01L 2924/1436* (2013.01); *H01L 2924/15311* (2013.01); *H01L 2924/15321* (2013.01)

(56) References Cited

U.S. PATENT DOCUMENTS

| | | |
|---|---|---|
| 2004/0164385 A1 | 8/2004 | Kado et al. |
| 2008/0006948 A1 | 1/2008 | Wu et al. |
| 2008/0160674 A1 | 7/2008 | Takiar et al. |
| 2012/0326282 A1 | 12/2012 | Sutardja |
| 2014/0021598 A1 | 1/2014 | Sutardja |

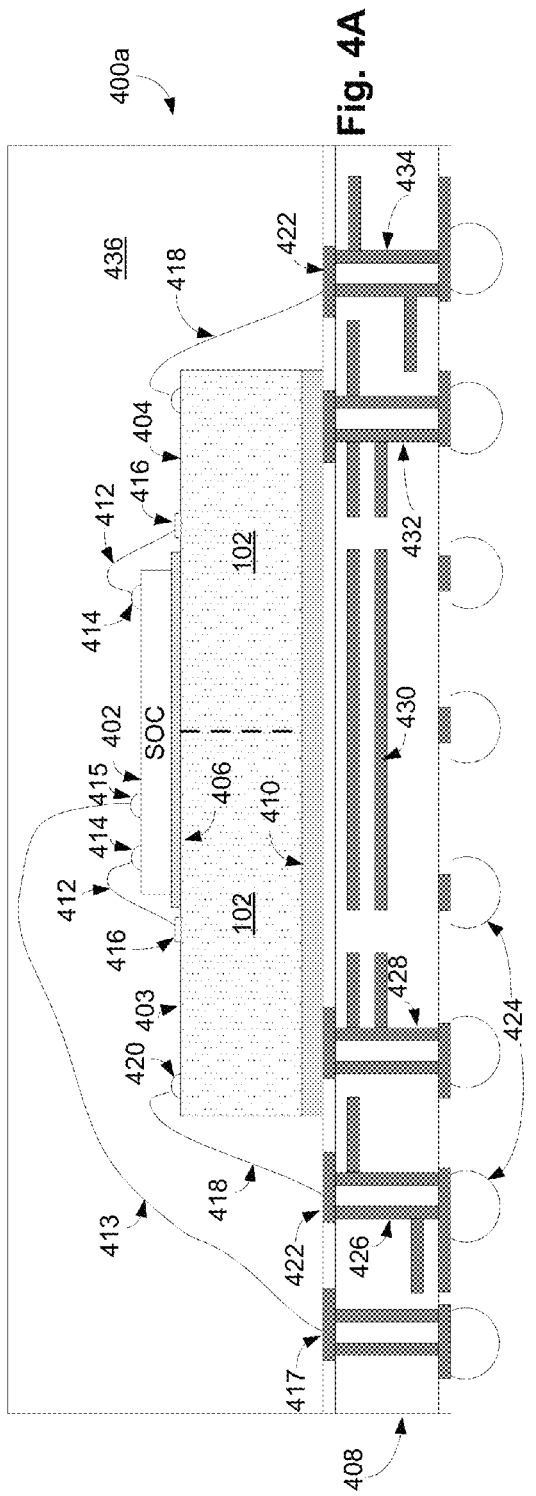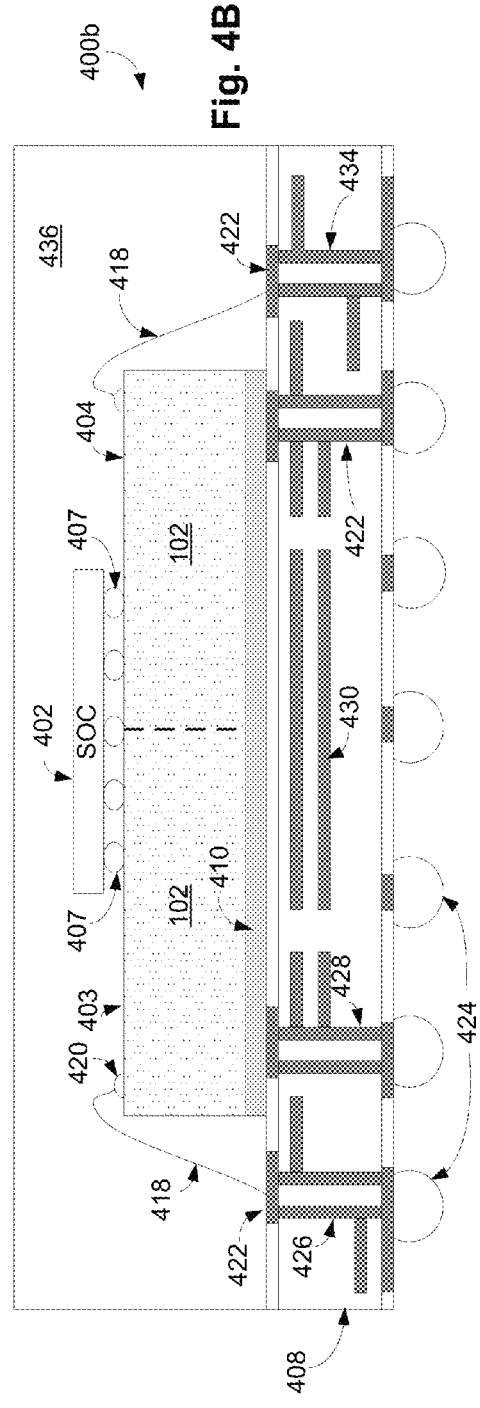

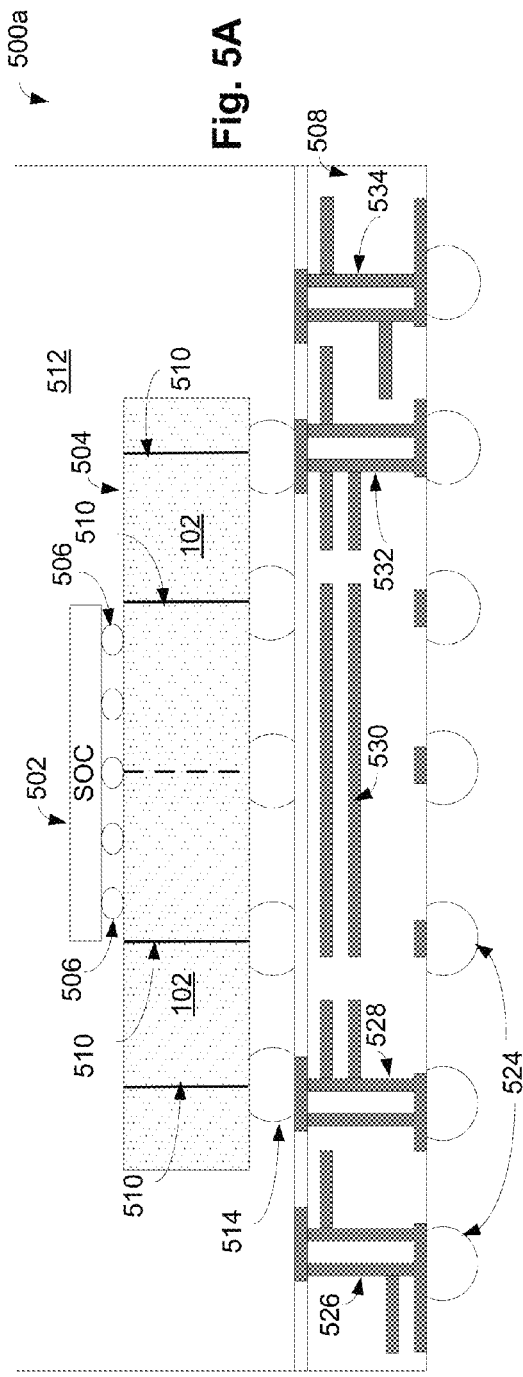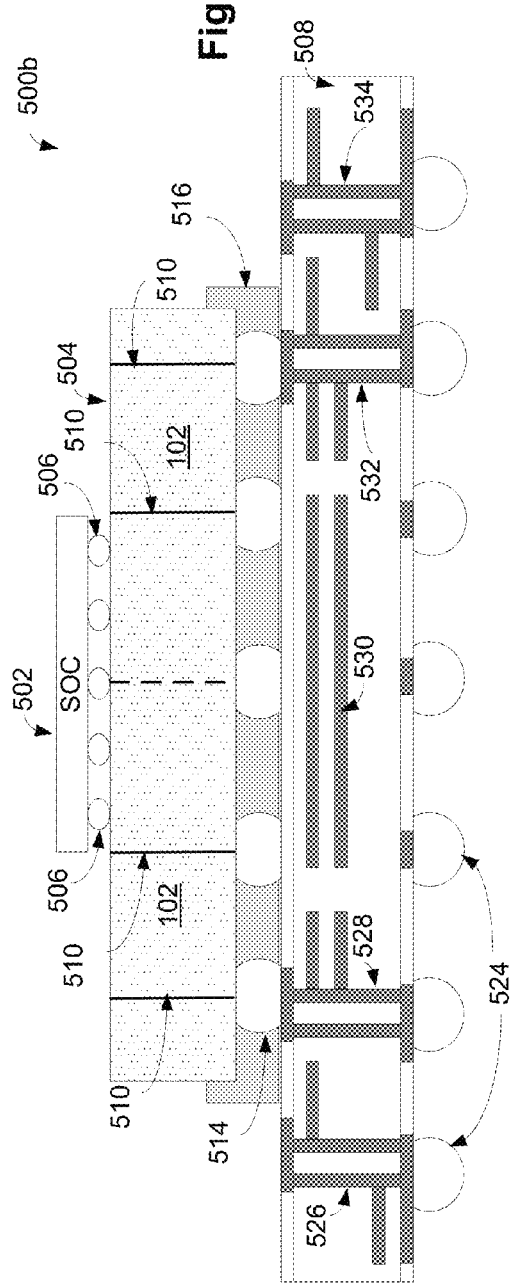

METHODS AND ARRANGEMENTS RELATING TO SEMICONDUCTOR PACKAGES INCLUDING MULTI-MEMORY DIES

CROSS-REFERENCES TO RELATED APPLICATIONS

The present disclosure is a divisional of and claims priority to U.S. patent application Ser. No. 13/532,444, filed Jun. 25, 2012, now U.S. Pat. No. 8,674,483, issued Mar. 18, 2014, which claims priority to U.S. Provisional Patent Application No. 61/642,364, filed May 3, 2012, and U.S. Provisional Patent Application No. 61/501,672, filed Jun. 27, 2011, which are incorporated herein by reference.

TECHNICAL FIELD

Embodiments of the present disclosure relate to the field of integrated circuits, and more particularly, to techniques, structures, and configurations for semiconductor chip packaging.

BACKGROUND

The background description provided herein is for the purpose of generally presenting the context of the disclosure. Work of the presently named inventor(s), to the extent the work is described in this background section, as well as aspects of the description that may not otherwise qualify as prior art at the time of filing, are neither expressly nor impliedly admitted as prior art against the present disclosure.

The size of semiconductor dies continues to decrease. More particularly, semiconductor dies that include System On Chip (SOC) configurations and semiconductor dies that are configured as memory dies such as, for example, dynamic random access memory (DRAM) dies are becoming increasingly smaller. Such decreasing of sizes of the semiconductor dies can lead to problems in stacking the dies within various semiconductor packaging arrangements.

SUMMARY

In various embodiments, there is provided a method that comprises providing a multi-memory die that comprises multiple individual memory dies. Each of the individual memory dies is defined as an individual memory die within a wafer of semiconductor material during production of memory dies. The multi-memory die is created by singulating the wafer of semiconductor material into memory dies where at least one of the memory dies is a multi-memory die that includes multiple individual memory dies that are still physically connected together. The method further comprises coupling a semiconductor die to the multi-memory die.

The present disclosure also provides an apparatus that comprises a multi-memory die that comprises multiple individual memory dies. Each of the individual memory dies is defined as an individual memory die within a wafer of semiconductor material during production of memory dies. The multi-memory die is created by singulating the wafer of semiconductor material into memory dies where at least one of the memory dies is a multi-memory die that includes multiple individual memory dies that are still physically connected together. The apparatus further comprises a semiconductor die coupled to the multi-memory die.

BRIEF DESCRIPTION OF THE DRAWINGS

Embodiments will be readily understood by the following detailed description in conjunction with the accompanying drawings. Embodiments are illustrated by way of example and not by way of limitation in the figures of the accompanying drawings.

FIGS. 4A and 4B schematically illustrate further examples of packaging arrangements for a semiconductor die coupled to a multi-memory die comprising multiple individual memory dies.

FIGS. 5A-5C schematically illustrate further examples of packaging arrangements for a semiconductor die coupled to a multi-memory die comprising multiple individual memory dies.

DETAILED DESCRIPTION

Figure 1A:
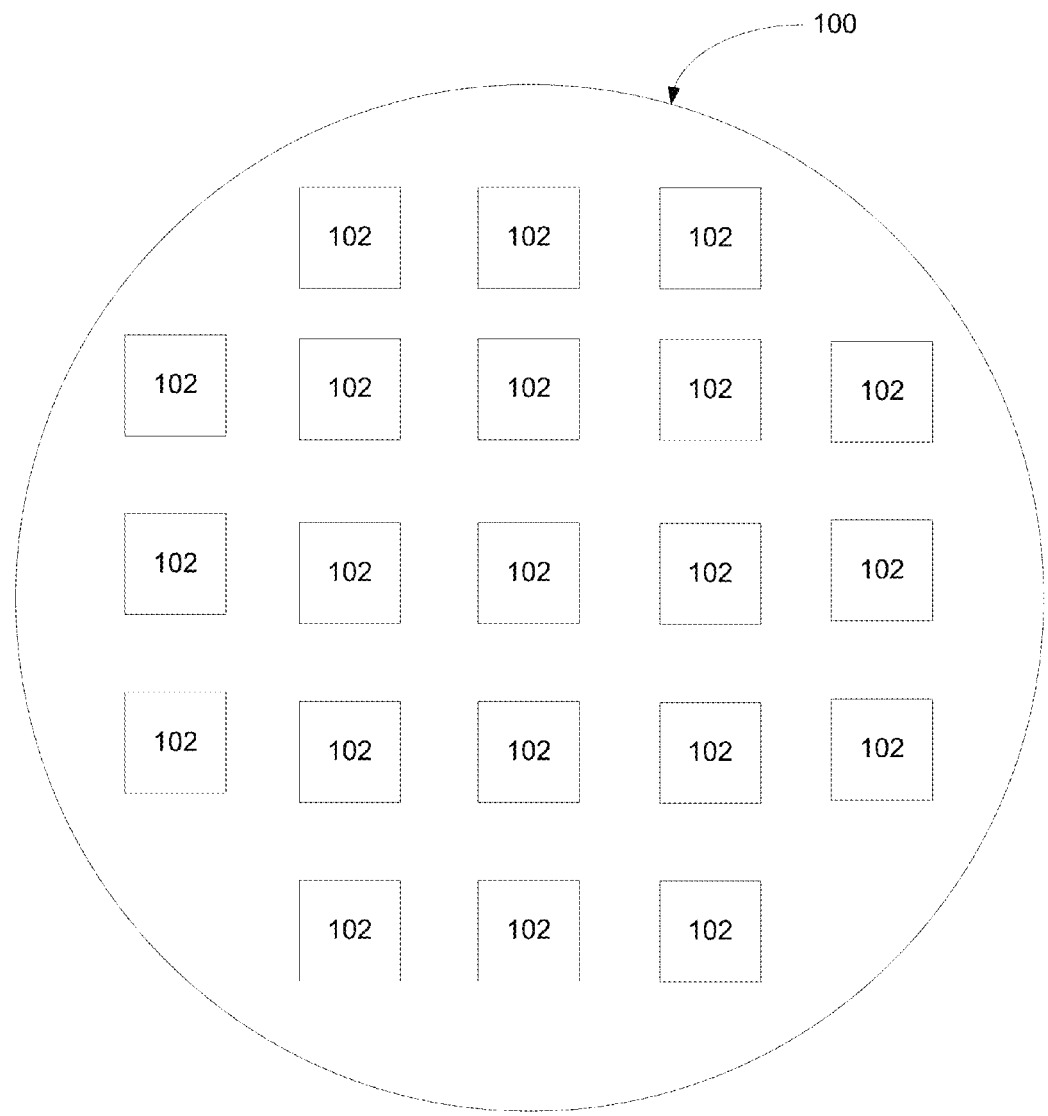
FIGS. 1A and 1B schematically illustrate an example of a wafer of semiconductor material configured with memory dies.

FIG. 1A schematically illustrates an example of a wafer 100 of semiconductor material that has been configured into a plurality of semiconductor dies 102 for production of semiconductor dies. The wafer 100 is singulated or divided, for example by cutting with a laser, into individual semiconductor dies 102 in order to provide a plurality of individual semiconductor dies 102 that have been physically separated from each other. In accordance with an embodiment, the plurality of individual semiconductor dies 102 are configured as individual memory dies 102, and more particularly, as individual dynamic random access memory (DRAM) dies 102. However, other types of memory dies are possible, as well as other types of semiconductor dies, and thus, the example of DRAM memory dies 102 is not meant to be limiting.

Figure 1B:
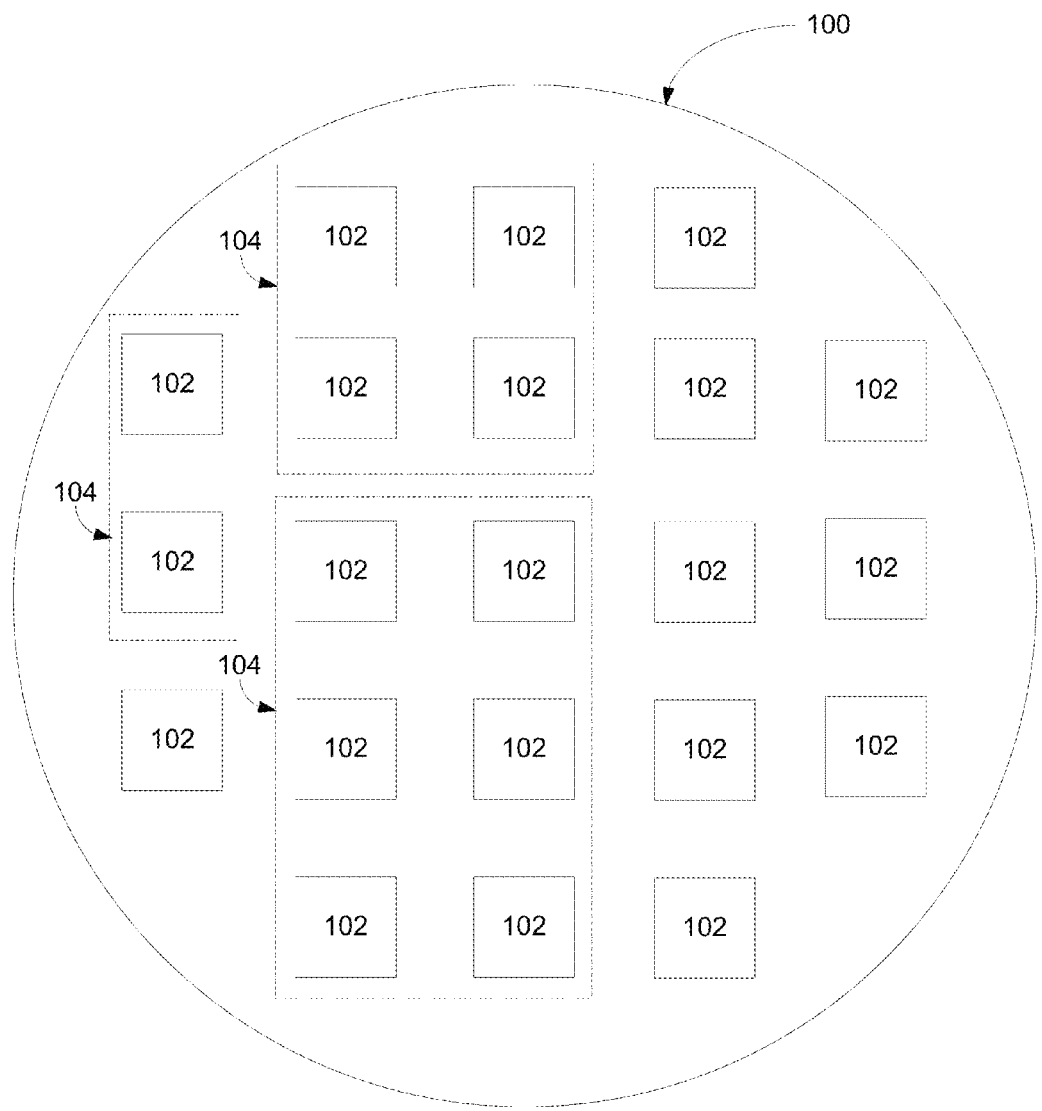

FIG. 1B schematically illustrates the wafer 100 of semiconductor material configured into a plurality multi-memory dies 104. As can be seen, each multi-memory die 104 includes multiple individual memory dies 102 that are still physically connected, i.e., they have not been singulated or separated from each other. Examples of multi-memory dies 104 can include arrangements of individual memory dies 102 of one by two, two by two, two by three, etc. These examples are not meant to be limiting.

Figure 2A:
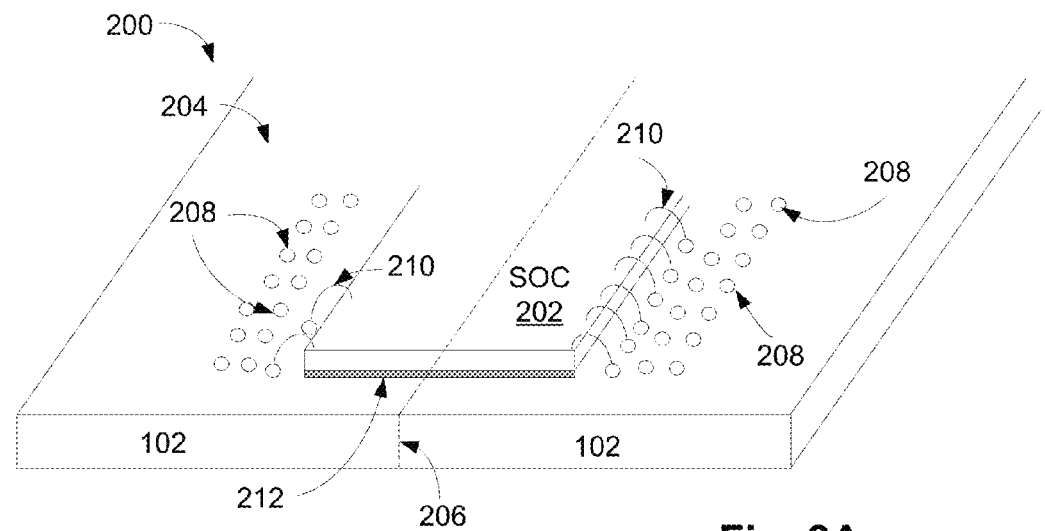
FIGS. 2A and 2B schematically illustrate a semiconductor die coupled to a multi-memory die comprising multiple individual dynamic random access memory (DRAM) dies.
Figure 2B:
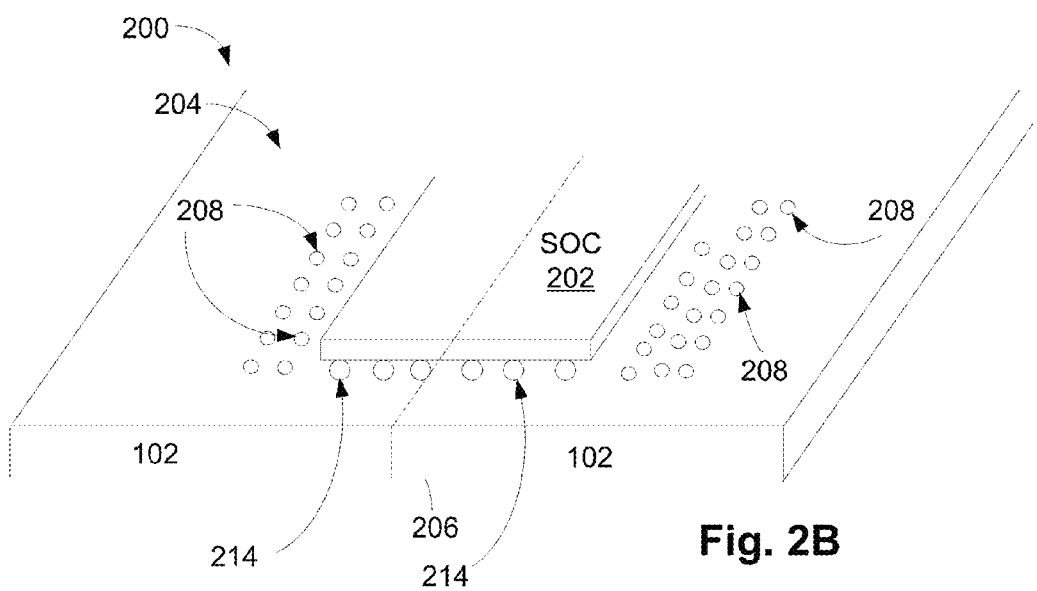

Referring to FIGS. 2A and 2B, an example of a packaging arrangement 200 is illustrated wherein a semiconductor die 202, configured as a System on a Chip (SOC) semiconductor die, is coupled to a multi-memory die 204. In the example, the arrangement 200 includes two individual DRAM dies 102 that are still physically connected, i.e. a one by two configuration. The SOC semiconductor die 202 is disposed on top of the multi-memory die 204 at or near a border 206 between two individual DRAM dies 102. As can be seen in FIGS. 2A and 2B, in general, DRAMs include input/output (I/O) pads or pins 208 in the center of an individual DRAM die 102. Thus, as can be seen in FIGS. 2A and 2B, the SOC semiconductor die 202 is located at or near the border 206 and between the I/O pads 208. FIG. 2A illustrates the SOC semiconductor die 202 coupled to the multi-memory die 204 via adhesive 212 and then coupled to the I/O pads 208 via a wire bonding process using wires 210. FIG. 2B illustrates the SOC semiconductor die 202 coupled to the multi-memory die 204 via a flip chip process and thus, in such an arrangement, the SOC semiconductor die 202 is not coupled to the I/O pads 208 of the multi-memory die 204 via wirebonding but is coupled to the multi-memory die 204 via solder balls 214 and bond pads (not illustrated).

Figure 2C:
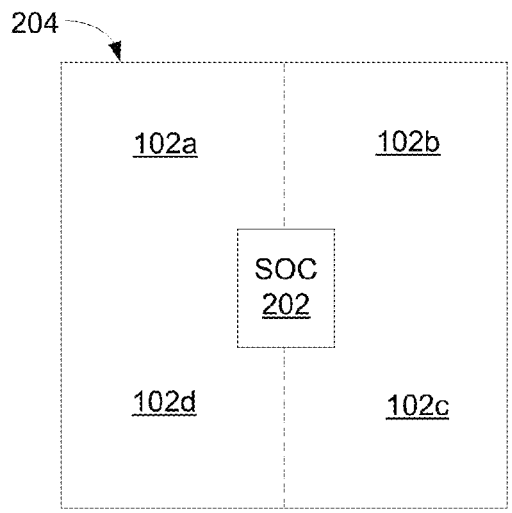
FIGS. 2C and 2D schematically illustrate top views of examples of a semiconductor die coupled to a multi-memory die comprising multiple individual memory dies.
Figure 2D:
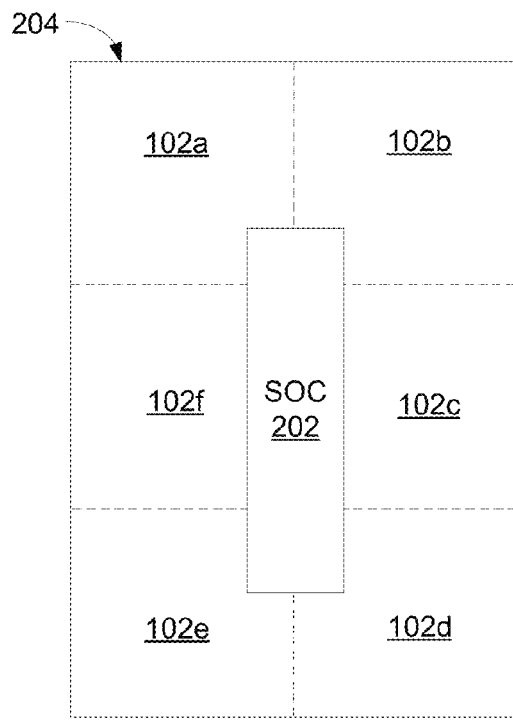

FIGS. 2C and 2D are top views illustrating an example of packaging arrangement 200 where the SOC semiconductor die 202 is disposed on a multi-memory die 204 where the multi-memory die 204 includes an arrangement of individual memory dies other than a one×two arrangement of individual memory dies 102. For example, FIG. 2C illustrates the SOC semiconductor die 202 disposed on a multi-memory die 204 that includes four individual memory dies 102a-d arranged in a two by two configuration. The SOC semiconductor die 202 can be connected to the multi-memory die 204 via suitable connections such as, for example, solder balls and bond pads (not illustrated), a wire bonding process, etc.

FIG. 2D illustrates another example of packaging arrangement 200 where the SOC semiconductor die 202 is disposed on a multi-memory die 204 that includes six individual memory dies 102a-f arranged in a two by three configuration. The semiconductor die 202 can be connected to the multi-memory die 204 via suitable connections such as, for example, solder balls and bond pads (not illustrated), a wire bonding process, etc.

Figure 3A:
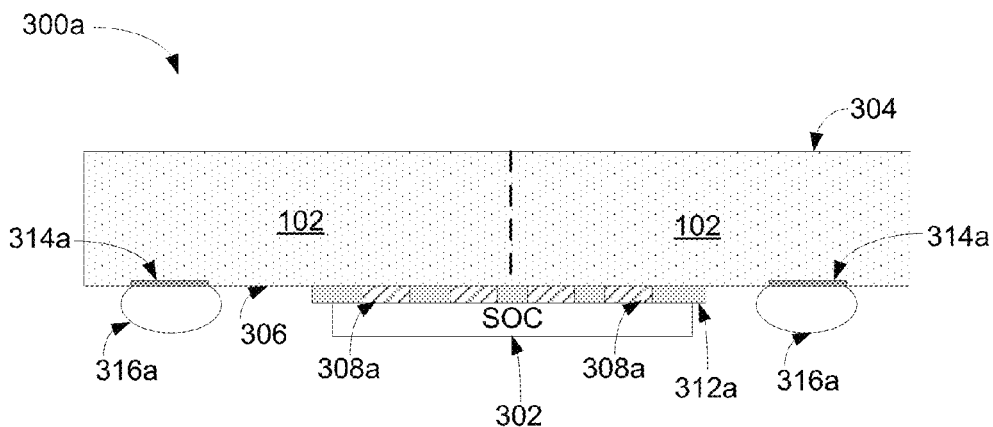
FIGS. 3A and 3B schematically illustrate examples of packaging arrangements for a semiconductor die coupled to a multi-memory die comprising multiple individual memory dies.

FIG. 3A illustrates an embodiment of a packaging arrangement 300a in accordance with various aspects of the present disclosure. In the packaging arrangement 300a, a semiconductor die 302 is coupled to a multi-memory die 304 that includes two individual memory dies 102 that are still physically connected. More individual memory dies 102 can be included if desired. In an embodiment, the individual memory dies 102 are DRAM dies. In accordance with various embodiments, the semiconductor die 302 is configured as a System on a Chip (SOC) semiconductor die 302. In the packaging arrangement 300a illustrated in FIG. 3A, the SOC semiconductor die 302 is coupled to a bottom surface 306 of the multi-memory die 304 via a flip chip process and thus, the multi-memory die 304 is physically coupled to the semiconductor die 302 via solder balls 308a. The solder balls 308a are coupled to bond pads (not illustrated) located on the multi-memory die 304 and bond pads (not illustrated) located on the SOC semiconductor die 302. Underfill material 312a is provided between the SOC semiconductor die 302 and the multi-memory die 304. A redistribution layer or fan-out layer (not illustrated) in the multi-memory die 304 is utilized to move or "fan out" the signals to and from the SOC semiconductor die 302 to bond pads 314a on the multi-memory die 304. Solder balls 316a are utilized at the bond pads 314a to couple the packaging arrangement 300a to another package or to a printed circuit board (PCB) (not illustrated) and thereby transmit signals between the packaging arrangement 300a and another package (not illustrated). Thus, the multi-memory die 304 serves as a substrate within the packaging arrangement 300a.

Figure 3B:
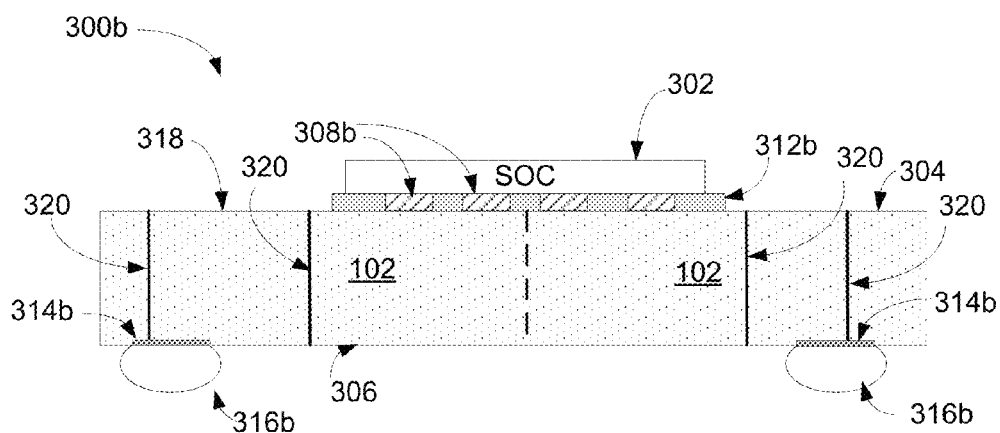

While FIG. 3A illustrates the SOC semiconductor die 302 coupled to the multi-memory die 304 along the bottom surface 306 of the multi-memory die 304, the SOC semiconductor die 302 may be coupled to a top surface 318 of the multi-memory die 304 if desired. FIG. 3B illustrates an example of a packaging arrangement 300b similar to that illustrated in FIG. 3A, wherein the SOC semiconductor die 302 is coupled to the top surface 318 of the multi-memory die 304. The SOC semiconductor die 302 is flip chip attached to the top surface 318 of the multi-memory die 304 via solder balls 308b. The solder balls 308b are coupled to bond pads (not illustrated) on the top surface 318 of the multi-memory die 304 and bond pads (not illustrated) located on the SOC semiconductor die 302. Underfill material 312b is provided between the multi-memory die 304 and the SOC semiconductor die 302.

In the embodiment illustrated in FIG. 3A, in conjunction with a redistribution layer or fan-out layer (not illustrated), signals from the SOC semiconductor die 302 are moved or transmitted through the multi-memory die 304 via through silicon vias (TSVs) 320. Solder balls 316b can be utilized at end points of the TSVs 320 that terminate in bond pads 314b to couple the packaging arrangement 300b to another package or PCB (not illustrated). Either packaging arrangement 300a or 300b can be configured with TSVs 320 and/or with a redistribution layer (not illustrated) in the multi-memory die 304.

FIGS. 4A and 4B illustrate packaging arrangements 400a and 400b, respectively. In the packaging arrangement 400a of FIG. 4A, a semiconductor die 402 is coupled to a top surface 403 of a multi-memory die 404 that includes two individual memory dies 102 that are still physically connected. More individual memory dies 102 can be included if desired. In accordance with an embodiment, the semiconductor die 402 is an SOC semiconductor die.

The SOC semiconductor die 402 is coupled to the top surface 403 of the multi-memory die 404 via an adhesive 406. The multi-memory die 404 is coupled to a substrate 408 via an adhesive 410. In the packaging arrangement 400a illustrated in FIG. 4A, a wirebonding process is used to further couple the SOC semiconductor die 402 to the multi-memory die 404, and the multi-memory die 404 to the substrate 408. Wires 412 are coupled to bond pads 414 on the SOC semiconductor die 402 and bond pads 416 on the multi-memory die 404. The wirebonding between the SOC semiconductor die 402 and the multi-memory die 404 can be similar to that described with respect to FIG. 2A, especially in an embodiment where the individual memory dies 102 are DRAM dies. Wires 418 are coupled to bond pads 420 on the multi-memory die 404 and bond pads 422 on the substrate 408. The wires 412 and 418 can be used to transmit signals between the SOC semiconductor die 402, the multi-memory die 404 and the substrate 408, along with a redistribution layer (not illustrated) in the multi-memory die 404. The SOC semiconductor die 402 in FIG. 4A may also be coupled directly to the substrate 408 via a wire bonding process. The SOC semiconductor die 402 may be coupled via a wire 413 coupled to a bond pad 415 on the SOC semiconductor die 402 and a bond pad 417 located on the substrate 408. Multiple wires 413, bond pads 415 and 417 may be included to provide multiple connections between the SOC semiconductor die 402 and the substrate 408 if desired. Additionally, the substrate 408 can be coupled to another package or a PCB (not shown) via solder balls 424.

The packaging arrangement 400b illustrated in FIG. 4B is similar to that illustrated in FIG. 4A. However, the SOC semiconductor die 402 is attached to the multi-memory die 404 via a flip chip attach process. Thus, signals between the SOC semiconductor die 402 and the multi-memory die 404 are transmitted via solder balls 407 located between bond pads (not illustrated) located on the SOC semiconductor die 402 and bond pads (not illustrated) located on the multi-memory die 404. Underfill material (not illustrated) may be included between the SOC semiconductor die 402 and the multi-memory die 404 if desired.

In the packaging arrangement 400b illustrated in FIG. 4B, the multi-memory die 404 is coupled to a substrate 408 via an adhesive 410 and a wire bonding process similar to that with respect to FIG. 4A. Thus, wires 418 are coupled to bond pads 420 on the multi-memory die 404 and bond pads 422 on the substrate 408. The wires 418 can be used to transmit signals between the multi-memory die 404 and the substrate 408. Signals between the SOC semiconductor die 402 and the substrate 408 can be transmitted through a redistribution layer (not illustrated) in the multi-memory die 404, and the flip chip connection between the SOC semiconductor die 402 and the multi-memory die 404. The substrate 408 can be coupled to another package or a PCB (not shown) via solder balls 424.

In packaging arrangements 400a and 400b, the substrate 408 further includes routing structures 426, 428, 430, 432, and 434. The routing structures 426, 428, 430, 432, and 434 generally comprise an electrically conductive material, e.g., copper, to route electrical signals through the substrate 408.

As illustrated, the routing structures 426, 428, 430, 432, and 434 can include line-type structures to route the electrical signals within a layer of the substrate 408 and/or via-type structures to route the electrical signals through a layer of the substrate 408. In other embodiments, routing structures 426, 428, 430, 432, and 434 can include other configurations in addition to or in lieu of those depicted here. While a particular configuration of routing structures has been briefly described and illustrated for the substrate 408, other configurations of routing structures may be used within substrate 408. As previously noted, solder balls 424 can be coupled to the substrate 408 at bond pads and TSVs of the routing structure and utilized to couple the packaging arrangements 400a and 400b to another package or to a PCB (not shown). A molded body 436 can be included in the packaging arrangements 400a and 400b if desired.

FIGS. 5A and 5B illustrate packaging arrangements 500a and 500b, respectively, that are similar to the packaging arrangement 400b illustrated in FIG. 4B. However, in the packaging arrangements 500a and 500b illustrated in FIGS. 5A and 5B, a multi-memory die 504 includes TSVs 510 for routing signals to and from a semiconductor die 502 through the multi-memory die 504 in conjunction with a redistribution layer (not illustrated). The multi-memory die 504 includes two individual memory dies 102 that are still physically connected. More individual memory dies 102 can be included if desired. In accordance with an embodiment, the semiconductor die 502 is an SOC semiconductor die.

The SOC semiconductor die 502 is coupled to the multi-memory die 504 via a flip chip attach process. Thus, signals between the SOC semiconductor die 502 and the multi-memory die 504 are transmitted via solder balls 506 located between bond pads (not illustrated) located on the SOC semiconductor die 502 and bond pads (not illustrated) on the multi-memory die 504. The packaging arrangement 500a includes a molded body 512 that can be utilized to protect the various components of the packaging arrangement 500a. The multi-memory die 504 is coupled to the substrate via solder balls 514. Underfill material (not illustrated) can be included between the multi-memory die 504 and the substrate 508 if desired.

In the packaging arrangement 500b of FIG. 5B, no molded body 512 is provided within the packaging arrangement. Underfill material 516 is included between the multi-memory die 504 and the substrate 508. As with the packaging arrangement 500a of FIG. 5A, the multi-memory die 504 includes TSVs 510 for routing signals to and from the SOC semiconductor die 502 through the multi-memory die 504 as opposed to a redistribution layer (although the multi-memory die 504 may still include a redistribution layer if desired). The SOC semiconductor die 502 is coupled to the multi-memory die 504 via a flip chip attach process. Thus, signals between the SOC semiconductor die 502 and the multi-memory die 504 are transmitted via solder balls 506 located between bond pads (not illustrated) located on the SOC semiconductor die 502 and bond pads (not illustrated) on the multi-memory die 504.

As in the packaging arrangements 400a and 400b of FIGS. 4A and 4B, the substrate 508 further includes routing structures 526, 528, 530, 532, and 534. The routing structures 526, 528, 530, 532, and 534 generally comprise an electrically conductive material, e.g., copper, to route electrical signals through the substrate 508.

As illustrated, the routing structures 526, 528, 530, 532, and 534 can include line-type structures to route the electrical signals within a layer of the substrate 508 and/or via-type structures to route the electrical signals through a layer of the substrate 508. In other embodiments, the routing structures 526, 528, 530, 532, and 534 can include other configurations in addition to or in lieu of those depicted here. While a particular configuration of routing structures has been briefly described and illustrated for the substrate 508, other configurations of routing structures may be used within substrate 508. Solder balls 524 can be coupled to the substrate 508 at bond pads and TSVs of the routing structures and utilized to couple the packaging arrangements 500a and 500b to another package or to a PCB (not shown).

Figure 5C:
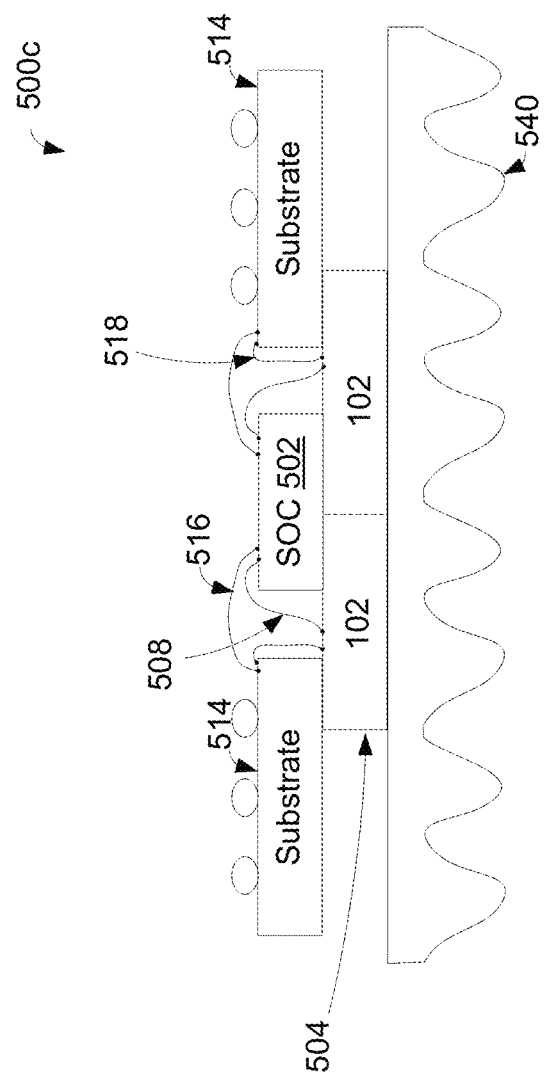

FIG. 5C illustrates another example of a packaging arrangement 500c. In the embodiment illustrated in FIG. 5C, a multi-memory die 504 is disposed on a heat sink 540. The multi-memory die 504 is coupled to the heat sink 540 via adhesive, epoxy, etc. (not illustrated). An SOC semiconductor die 502 is disposed on the multi-memory die 504. The SOC semiconductor die 502 is coupled to the multi-memory die 504 via adhesive, epoxy, etc. (not illustrated). Wires 508 are used to couple the SOC semiconductor die 502 to the multi-memory die 504 via bond pads (not illustrated). Two substrates 514 are coupled to the multi-memory die 504 on each side of the multi-memory die 504. Wires 516 are used to couple the SOC semiconductor 502 to the substrates 514 via bond pads (not illustrated). The multi-memory die 504 may also be coupled to the substrates 514 directly by wires 518 (bond pads not illustrated). The multi-memory die 504 may be coupled to the substrates 514 through the SOC semiconductor die 502 due to the wire bond process that couples the SOC semiconductor die 502 to the substrates 514. The multi-memory die 504 may also be coupled to the substrates 514 via solder balls and bond pads (not illustrated). Alternatively, the multi-memory die 504 may be coupled to the substrates 514 via a wire bonding process (not illustrated), with additional physical coupling to the substrates 514 via, for example, an adhesive, epoxy, solder balls, etc. (not illustrated). Solder balls 520 are provided to allow the packaging arrangement 500c to be coupled to, for example, a substrate or printed circuit board (PCB), another packaging arrangement, etc. (not illustrated).

Figure 6A:
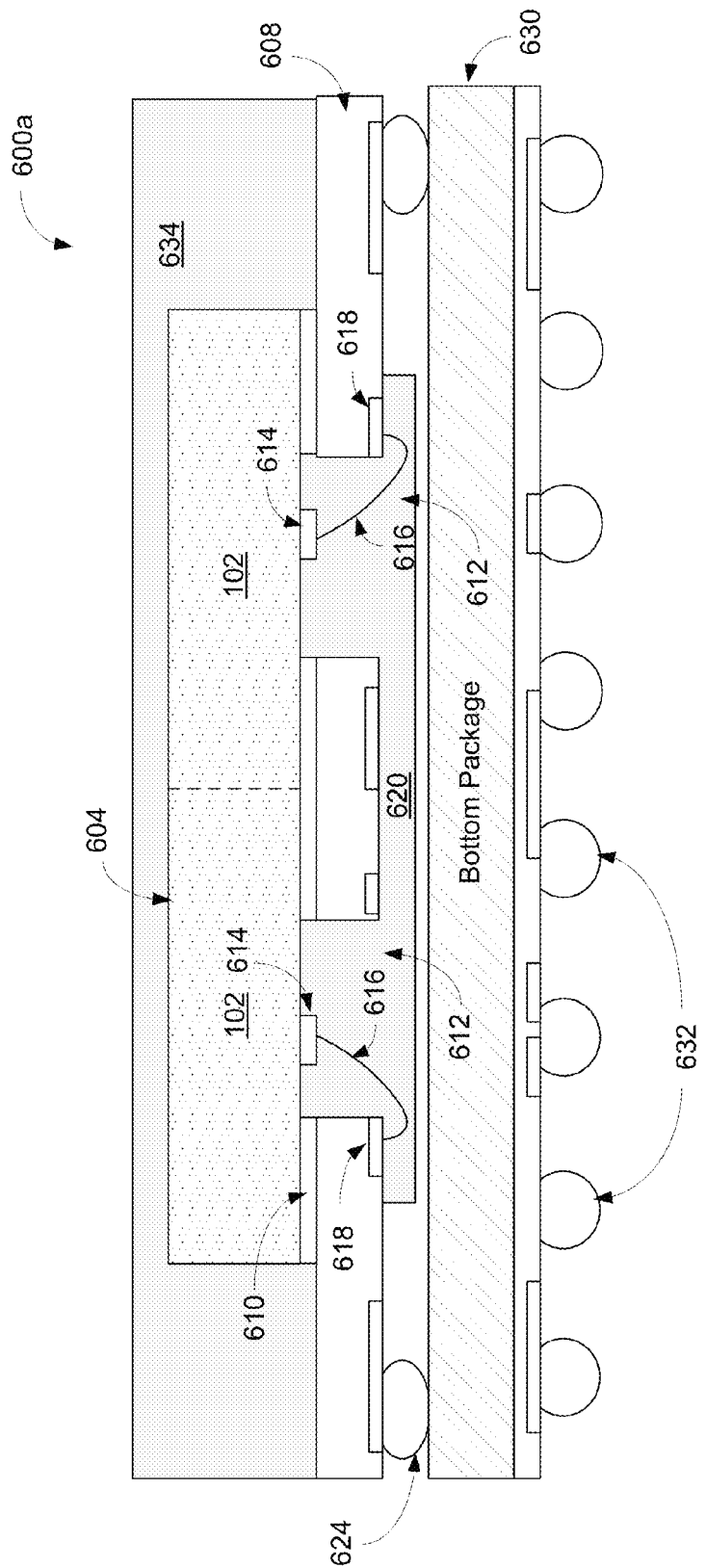
FIGS. 6A and 6B schematically illustrate further examples of packaging arrangements for a semiconductor die coupled to a multi-memory die comprising multiple individual memory dies.
Figure 6B:
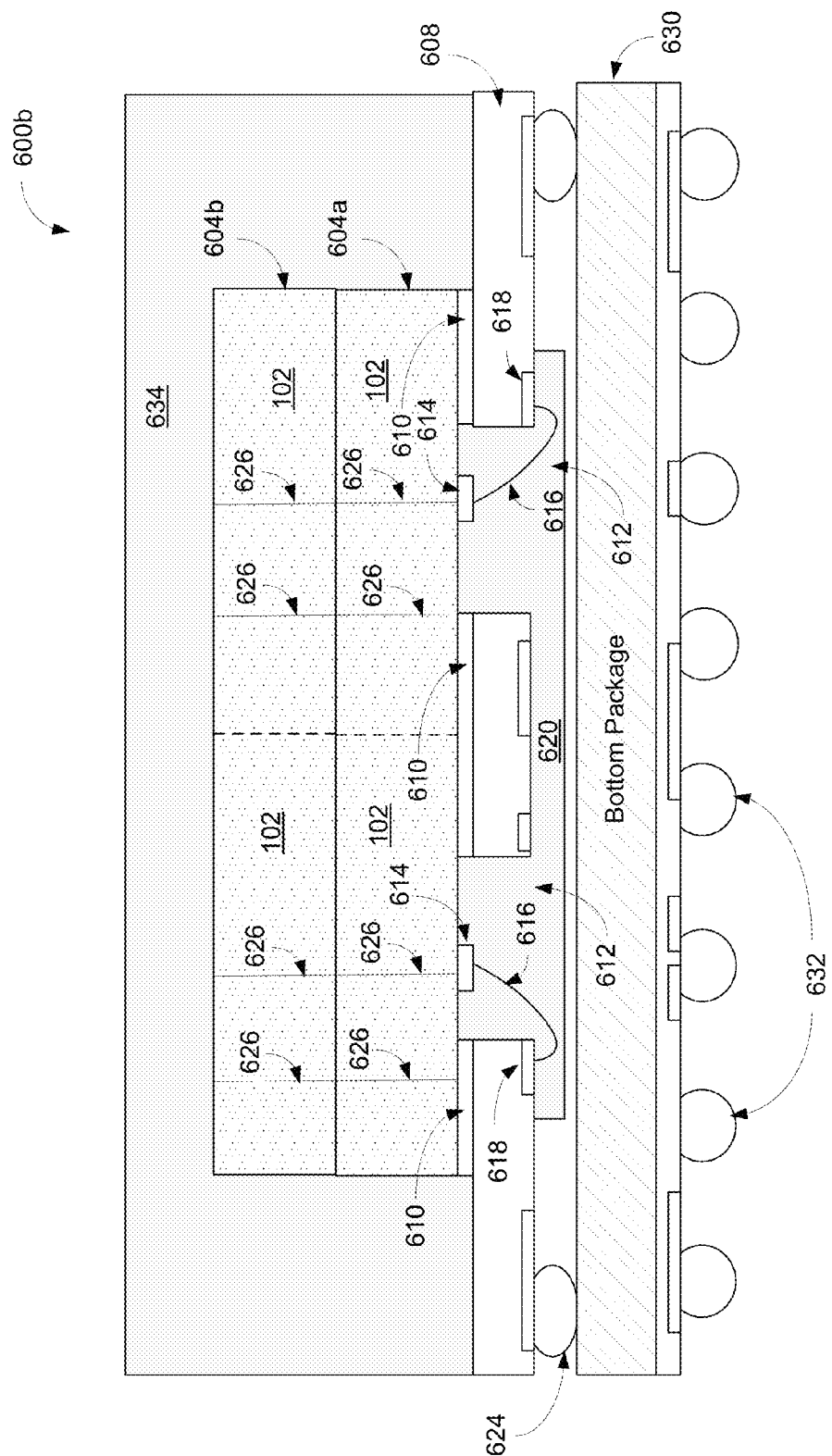

FIGS. 6A and 6B illustrate packaging arrangements 600a and 600b, respectively, that include a multi-memory die 604 that includes two individual memory dies 102 that are still physically connected. More individual memory dies 102 can be included if desired. In the packaging arrangement 600a, the multi-memory die 604 is coupled to a substrate 608 via adhesive 610. Windows 612 are defined within the substrate 608 such that bond pads 614 on the multi-memory die 604 can be coupled to the substrate 608 via a wire bonding process. Thus, wires 616 couple bond pads 614 of the multi-memory die 604 to bond pads 618 located on the substrate 608. A passivation material 620 can be provided to protect the wire bond connections. A molded body 634 can be provided if desired.

The packaging arrangement 600a can be coupled to another package 630 via solder balls 624. Such a package 630 can be any other type of package such as, for example, a processor package, a memory package, a System on Chip package, etc. The resulting overall package can then be coupled to another package or to a PCB (not shown) via solder balls 632.

FIG. 6B illustrates a packaging arrangement 600b similar to packaging arrangement 600a illustrated in FIG. 6A. The packaging arrangement 600b includes multiple, multi-memory dies 604 stacked atop one another. The multi-memory dies 604 electrically communicate with each other via TSVs 626 and/or redistribution layers (not illustrated). The bottom multi-memory die 604a passes signals to and from the substrate 608 via the wire bond arrangement between the bottom multi-memory die 604a and the substrate 608. The substrate 608 generally includes a redistribution layer (not illustrated). A molded body 634 can be provided if desired.

Figure 7:
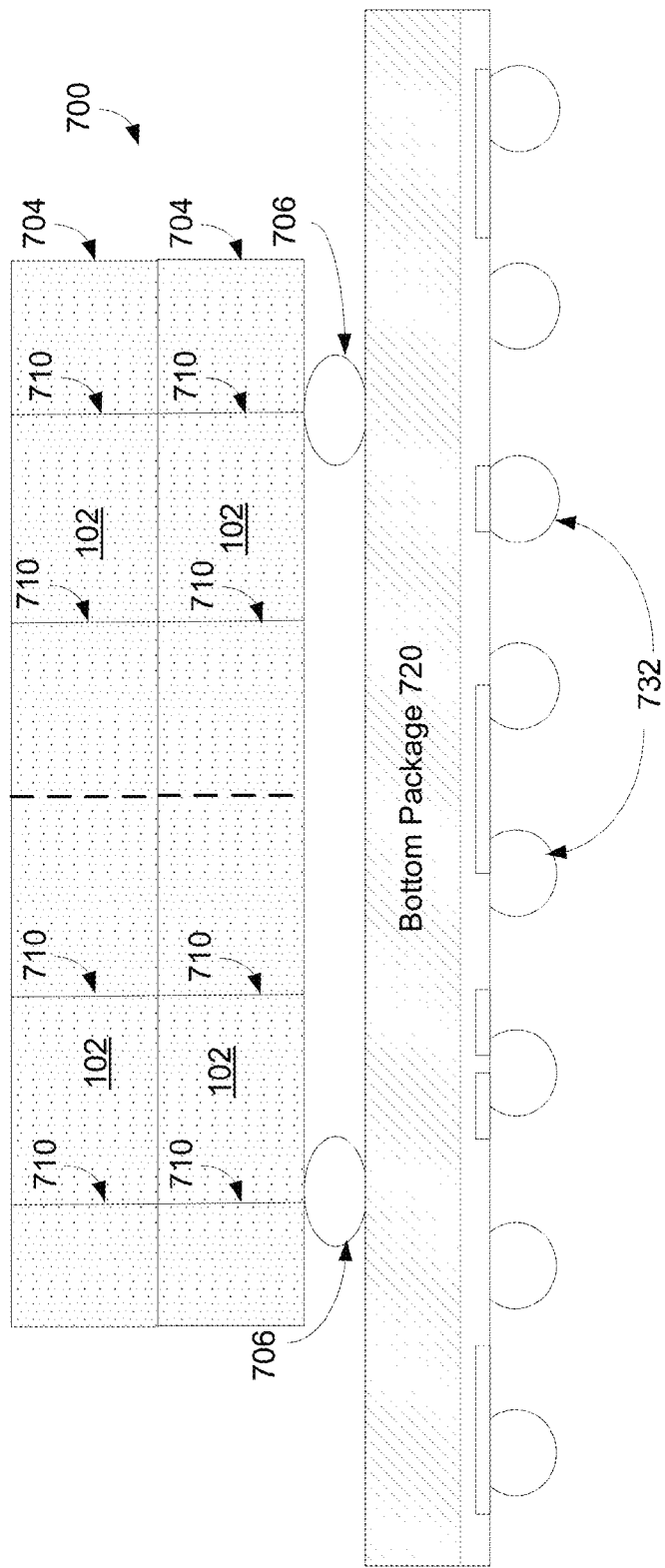
FIG. 7 schematically illustrates an example of a packaging arrangement for a multi-memory die comprising multiple individual memory dies.

FIG. 7 illustrates a packaging arrangement 700 that includes multiple multi-memory dies 704 stacked atop one another and coupled to a package 720 via solder balls 706. TSVs 710, along with redistribution layers (not illustrated) within the multi-memory dies 704, are utilized to transmit signals among the multiple multi-memory dies 704 and to the second package 720. Each multi-memory die 704 includes two individual memory dies 102 that are still physically connected. More individual memory dies 102 can be included if desired. While FIG. 7 illustrates only two multi-memory dies 704 stacked on top of each other, depending upon the design and application for the packaging arrangement 700, the packaging arrangement 700 may include more than two multi-memory dies 704 stacked atop one another. A molded body (not illustrated) may be provided around the stacked multi-memory dies 704 if desired. The resulting overall package can then be coupled to another package or to a PCB (not shown) via solder balls 732.

Figure 8A:
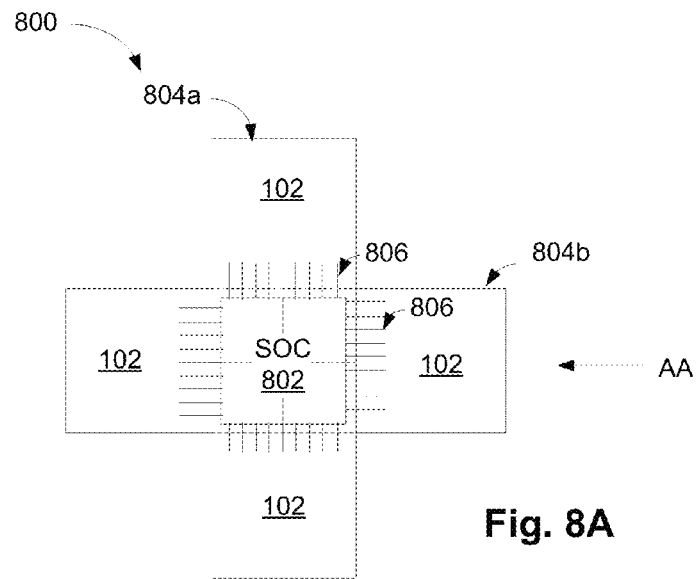
FIG. 8A schematically illustrates a top view of an example of a packaging arrangement including two multi-memory dies each comprising two individual memory dies.
Figure 8B:
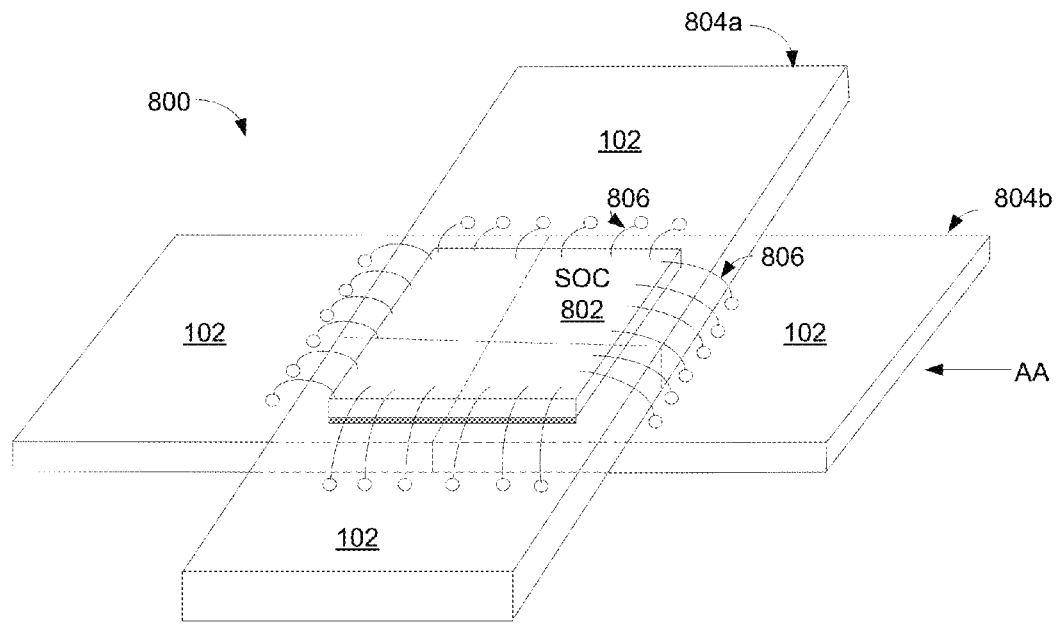
FIG. 8B schematically illustrates a perspective view of the packaging arrangement illustrated in FIG. 8A.

Referring to FIG. 8A, a top view of an example of a packaging arrangement 800 is illustrated. FIG. 8B provides a perspective view of the packaging arrangement 800. The packaging arrangement 800 includes a semiconductor die 802. In an embodiment, the semiconductor die 802 is configured as an SOC semiconductor die 802. The packaging arrangement 800 also includes a first multi-memory die 804a and a second multi-memory die 804b. In one embodiment, each of the first and second multi-memory dies 804a, 804b includes two individual memory dies 102, as previously described, in a one by two configuration. In accordance with an embodiment, the individual memory dies 102 are dynamic random access memory (DRAM) dies. Connections are provided by bond wires 806 between the SOC semiconductor die 802 and the multi-memory dies 804a, 804b via bond pads (not illustrated) located on both the SOC semiconductor die 802 and the multi-memory dies 804a, 804b.

Figure 9:
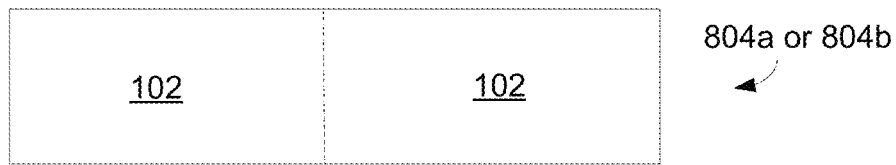
FIG. 9 schematically illustrates a top view of each of the first and second multi-memory dies of the packaging arrangement of FIGS. 8A and 8B.
Figure 10:
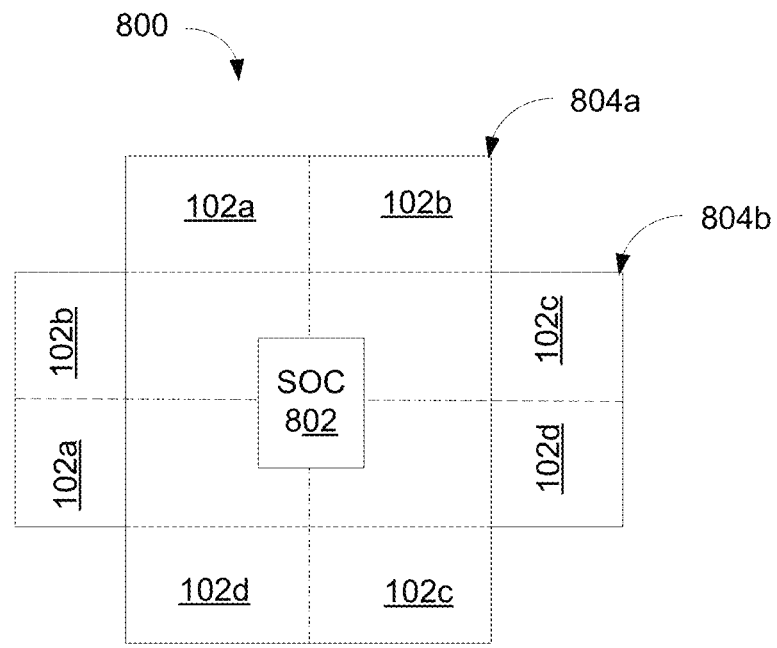
FIG. 10 schematically illustrates a top view of a semiconductor die coupled to two multi-memory dies each comprising multiple individual memory dies.

FIG. 9 illustrates a top view of each of the first and second multi-memory dies 804a, 804b, where each of the multi-memory dies 804a, 804b includes two individual memory dies 102 arranged in a one by two configuration. In other embodiments, the first and second multi-memory dies 804a, 804b may each include more than two memory dies 102. For example, each of the first and second multi-memory dies 804a, 804b may include four dies 102a-d arranged in a two by two configuration as illustrated in FIG. 10. Other possible configurations for the first and second multi-memory dies 804a, 804b are also previously described herein, e.g. six dies in a two by three configuration, three dies in a one by three configuration, etc. Additionally, the multi-memory dies 804a, 804b may each have a different number of individual memory dies 102 and/or a different configuration with respect to each other.

Referring back to FIGS. 8A and 8B, the first multi-memory die 804a is stacked on top of the second multi-memory die 804b forming a cross-like configuration. The SOC semiconductor die 802 is stacked on top of the first multi-memory die 804a. As previously noted, connections are provided by bond wires 806 between the SOC semiconductor die 802 and the multi-memory dies 804a, 804b via bond pads (not illustrated) located on both the SOC semiconductor die 802 and the multi-memory dies 804a, 804b. The SOC semiconductor die 802 and the first and second multi-memory dies 804a, 804b can be coupled to each other via an adhesive, epoxy, solder balls, etc. (not illustrated).

Figure 11:
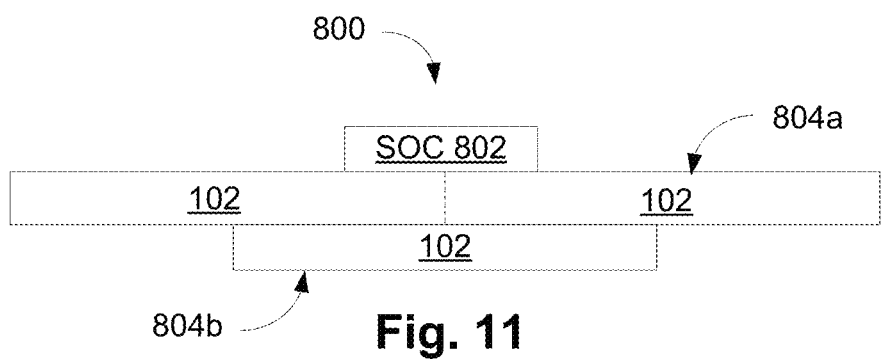
FIG. 11 schematically illustrates a side view of the packaging arrangement of FIGS. 8A and 8B.

FIG. 11 is a side view of the packaging arrangement 800 illustrated in FIGS. 8A and 8B as viewed from the direction AA. For simplicity of illustration, connections from the SOC semiconductor die 802 to the multi-memory dies 804a, 804b are omitted.

Figure 12:
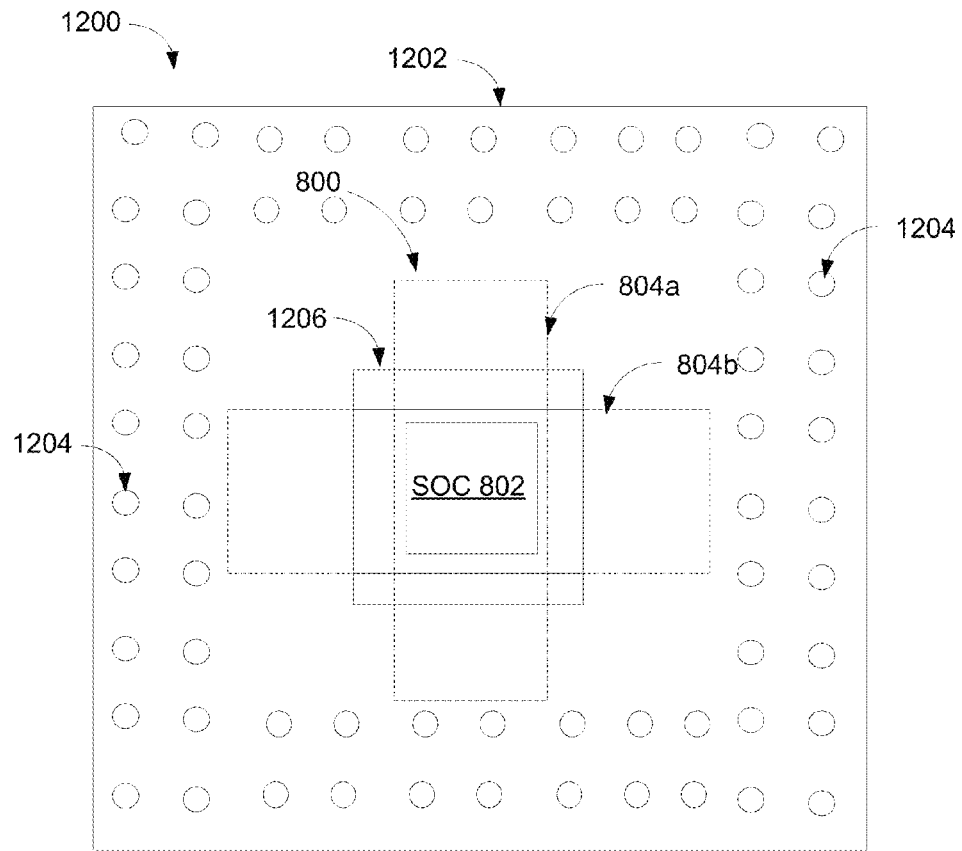
FIG. 12 schematically illustrates a top view of a semiconductor package that includes the packaging arrangement of FIGS. 8A and 8B.

Referring to FIG. 12, the packaging arrangement 800 illustrated in FIGS. 8A and 8B may further be combined with a substrate or printed circuit board (PCB) (hereinafter substrate) 1202 to provide a semiconductor package 1200. FIG. 12 provides a top view of the semiconductor package 1200.

The semiconductor package 1200 includes the substrate 1202 and the packaging arrangement 800. The substrate 1202 includes rows of solder balls (or a ball grid array) 1204 and an opening 1206, which provides access to the SOC semiconductor die 802. The packaging arrangement 800 is located under the substrate 1202, as illustrated by the dash lines representing the first and second multi-memory dies 804a, 804b. Sections of the ball grid array 1204 may be divided to specifically handle signals from corresponding individual memory dies 102 in the first and second multi-memory dies 804a, 804b. The ball grid array 1204 can be used to couple the semiconductor package 1200 to another packaging arrangement or a substrate or printed circuit board (PCB) (not illustrated). For simplicity of illustration, connections from the packaging arrangement 800 to the substrate 1202 are not illustrated in FIG. 12.

Figure 13:
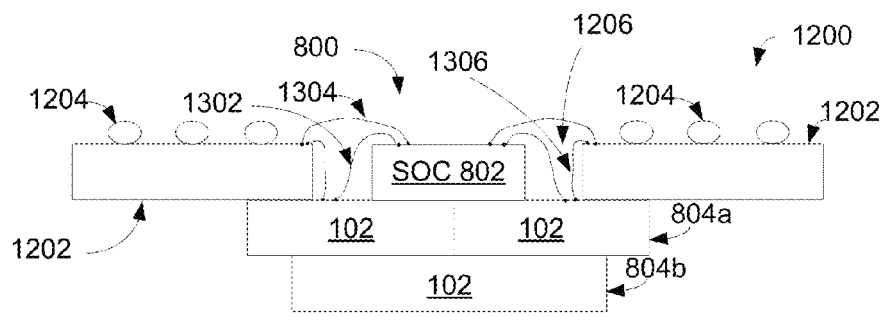
FIG. 13 schematically illustrates a side view of the semiconductor arrangement of FIG. 12.

FIG. 13 illustrates a cross-sectional view of the semiconductor package 1200 illustrated in FIG. 12. Through the opening 1206, connections can be established between the packaging arrangement 800 and the substrate 1202. In one embodiment, connections are provided between the first and second multi-memory dies 804*a*, 804*b* and the SOC semiconductor die 802 via wires 1302 (bond pads not illustrated), and connections are provided between the SOC semiconductor die 802 and the substrate 1202 via wires 1304 (bond pads not illustrated). Connections may also be provided between the first and second multi-memory dies 804*a*, 804*b* and the substrate 1202 via wires 1306 (bond pads not illustrated and wires between multi-memory die 804*b* and substrate 1202 not illustrated). Signals from the first and second multi-memory dies 804*a*, 804*b* can be first routed to the SOC semiconductor die 802. The SOC semiconductor die 802 can in turn re-route such signals to the substrate 1202. The reverse routing is also possible such that signals from the substrate 1202 can be first routed to the SOC semiconductor die 802 and the SOC semiconductor die 802 can in turn re-route such signals to the first and second multi-memory dies 804*a*, 804*b*. Other circuitry components may be further connected to the substrate 1202. In another embodiment (not illustrated), signals from the first and second multi-memory dies 804*a*, 804*b* may be routed directly to and from the substrate 1200 via the opening 1206 via wires and bond pads without going through the SOC semiconductor die 802. Such an embodiment may require a bigger opening 1206 than what is relatively illustrated in FIG. 12. Thus, the size of the opening 1206 illustrated in FIG. 12 is merely an example and is not meant to be limiting.

It should be noted that while the SOC semiconductor die 802 is described in connection with the packaging arrangement 800 and the semiconductor package 1200, the SOC semiconductor die 802 need not be included. For example, the semiconductor package 1200 as shown in FIGS. 12 and 13 may omit the SOC semiconductor die 802. Such an embodiment would thus include only the substrate 1202 and the first and second multi-memory dies 804*a*, 804*b*. In this particular configuration, signals are routed via direct connections, e.g. wires and bond pads, between the first and second multi-memory dies 804*a*, 804*b* and the substrate 1202 through the opening 1206.

Figure 14:
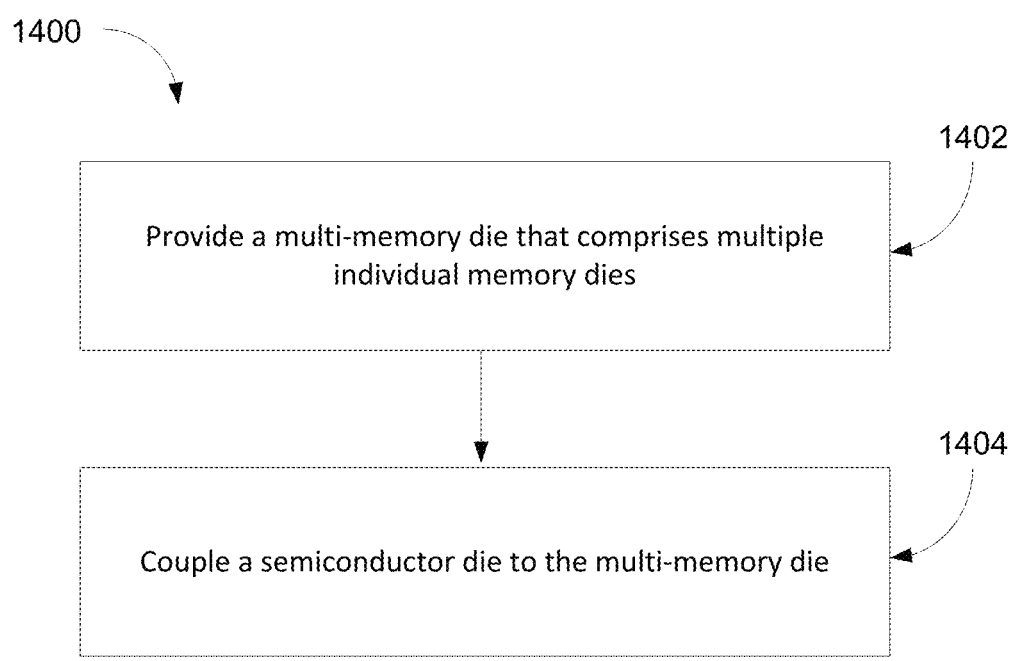
FIG. 14 illustrates an example of a method for creating a packaging arrangement that comprises a semiconductor die coupled to a multi-memory die comprising multiple individual memory dies.

FIG. 14 is a process flow diagram of a method 1400 to create a packaging arrangement that includes a multi-memory die. At 1402, the method 1400 includes providing a multi-memory die that comprises multiple individual memory dies. Each of the individual memory dies is defined as an individual memory die within a wafer of semiconductor material during production of memory dies. The multi-memory die is created by singulating the wafer of semiconductor material into memory dies where at least one of the memory dies is a multi-memory die that includes multiple individual memory dies that are still physically connected together. At 1404, the method includes coupling a semiconductor die to the multi-memory die.

As previously noted, while the various packaging arrangements include multi-memory dies 204, 304, 404, 504, 604, 704, and 804*a*, 804*b* that are illustrated with only two individual memory dies 102 that are still physically connected, depending upon the design and the application for the packaging arrangements, the multi-memory dies 204, 304, 404, 504, 604, 704 and 804*a*, 804*b* may include more than two individual memory dies 102 that are still physically connected. Additionally, the multi-memory dies 204, 304, 404, 504, 604 704 and 804*a*, 804*b* within a particular packaging arrangement 200, 300, 400, 500, 600 700 and 800 may each have a different number of individual memory dies 102 and/or a different configuration with respect to each other. Likewise, while the semiconductor dies 202, 302, 402, 502 and 802 are primarily described as SOC semiconductor dies, other types of semiconductor dies may be used. Furthermore, details with respect to various operations and materials for creating the various components and coupling the various components together have been omitted for clarity and to avoid implying any types of limitations since such details are well known.

In embodiments where the multi-memory dies are DRAMs, the connection between the SOC semiconductor die and the DRAM I/O's are very short. This can allow the interface speed between the DRAM and the SOC to be run at the maximum possible speed without using any power hungry resistive termination. Additionally, a minimum of two channels of DRAM interface can be achieved naturally without any congestion due to the natural separation of the DRAM interface. Also, the control channels of the DRAM can be shared naturally if two channels are not needed. This allows for the achievement of twice the bandwidth naturally.

Using the multi-memory dies as a substrate allows the substrate to serve as a good heat sink for the SOC semiconductor die if chip to chip bonding is used. The multi-memory die can be used as a fan out substrate for an ultra low cost wire bond substrate. Even though the heat dissipation capability is reduced compared to exposed multi-memory die, the multi-memory die still creates a huge improvement in the heat dissipation capability of the SOC semiconductor die as the multi-memory die effectively acts as built-in heat spreader inside the packaging arrangements.

Embodiments of the present disclosure allow for a natural low cost package on package (POP) packaging for the multi-memory die. This can be done by using a dual window opening of the ball grid array substrate (e.g., the embodiments of FIGS. 6A and 6B). The I/O pins of the multi-memory die (e.g., a DRAM multi-memory die) can be routed to the edges of the multi-memory package where the multi-memory packages can be stacked on an SOC package. This creates a more natural (direct) connection between the SOC die and the DRAMs, thus promoting a much higher speed connection between the SOC die and the DRAM die(s) compared to traditional LP-DDR I/O placement on four sides of a DRAM package instead of the two sides of a dual core DRAM die (e.g., two individual DRAM dies in a multi-memory DRAM die) POP package. The two sided DRAM connection for a dual core DRAM POP also results in much lower parasitic capacitances, thus further promoting running the interface at even higher clock frequencies even when several DRAM dies are stacked on top of each other using TSV processes.

Ultimately, DRAM POP packaging may be eliminated by routing the I/O of the DRAM's to the outer edges of the dual core DRAM die and place solder balls right on top of the dual core DRAM die. This has a major benefit of reducing the packaging cost drastically while allowing very high ball density with a practically zero cost increase. This can be even more useful when the DRAM die is designed with more than a 16 b wide interface (e.g., 32 b). This is also extremely attractive when a substrate of the SOC semiconductor die packaging is already designed for high density flip chip mounting of the SOC semiconductor die. In such a situation, the POP is simply two semiconductor dies on top of each other. The one that is closest to the substrate (the center) is the SOC semiconductor die and the one furthest away from the substrate is the DRAM die. Both semiconductor dies are exposed to allow heat dissipation capability. The spacing in between the SOC semiconductor die and the DRAM semiconductor die may be filled with thermally conductive material to allow the heat from the SOC semiconductor die to transfer to the DRAM semiconductor die. A back of the DRAM semiconductor die may be matted to a heatsink to reduce the DRAM semiconductor die temperature and ultimately the SOC semiconductor die temperature.

Various operations may have been described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

The description may use the terms "embodiment" or "embodiments," which may each refer to one or more of the same or different embodiments. Furthermore, the terms "comprising," "including," "having," and the like, as used with respect to embodiments, are synonymous.

Although certain embodiments have been illustrated and described herein, it will be appreciated by those of ordinary skill in the art that a wide variety of alternate and/or equivalent embodiments or implementations calculated to achieve the same purposes may be substituted for the embodiments illustrated and described without departing from the scope. Those with skill in the art will readily appreciate that embodiments may be implemented in a very wide variety of ways. This application is intended to cover any adaptations or variations of the embodiments discussed herein. Therefore, it is manifestly intended that embodiments be limited only by the claims and the equivalents thereof.

What is claimed is:

1. A method comprising:
providing a multi-memory die that comprises multiple individual memory dies, wherein
each of the individual memory dies is defined as an individual memory die within a wafer of semiconductor material during production of memory dies, and
the multi-memory die is created by singulating the wafer of semiconductor material into memory dies where at least one of the memory dies is a multi-memory die that includes at least a first memory die and a second memory die that are physically connected together along a border region; and
coupling a semiconductor die to the multi-memory die, wherein the semiconductor die is mounted on at least a part of the border region of the multi-memory die.

2. The method of claim 1, wherein the semiconductor die comprises a System on a Chip.

3. The method of claim 1, wherein the semiconductor die is coupled to the multi-memory die via a flip chip process.

4. The method of claim 1, wherein:
the multi-memory die is coupled to a substrate via a flip chip process; and
the method further comprises coupling the semiconductor die to the substrate via through silicon vias defined within the multi-memory die.

5. The method of claim 4, further comprising:
providing a passivation material between the multi-memory die and the substrate.

6. The method of claim 5, further comprising:
providing a molded body over at least portions of (i) a top surface of the semiconductor die, (ii) a top surface of the multi-memory die, and (iii) a top surface of the substrate.

7. The method of claim 1, wherein the semiconductor die comprises another multi-memory die.

8. The method of claim 1, further comprising:
disposing the multi-memory die on a heat sink.

9. The method of claim 1, wherein:
the multi-memory die has (i) a first surface and (ii) a second surface that is opposite the first surface;
coupling the semiconductor die to the multi-memory die further comprises
mounting the semiconductor die to the first surface of the multi-memory die; and
the method further comprises
coupling a substrate on the first surface of the multi-memory die.

10. The method of claim 9, wherein:
the multi-memory die, the semiconductor die and the substrate are included in a first semiconductor package; and
the substrate is configured to electrically connect the first semiconductor package to a second semiconductor package.

11. The method of claim 9, further comprising:
coupling a heat sink on the second surface of the multi-memory die.

12. The method of claim 1, wherein the multi-memory die is a first multi-memory die, and wherein the method further comprises:
providing a second multi-memory die that comprises corresponding multiple individual memory dies; and
mounting the second multi-memory die on the first multi-memory die.

13. The method of claim 12, wherein the semiconductor die is mounted on the first multi-memory die, and wherein the method further comprises:
coupling the semiconductor die to the first multi-memory die via a wire bonding process using a first plurality of wires; and
coupling the semiconductor die to the second multi-memory die via a wire bonding process using a second plurality of wires.

14. The method of claim 12, wherein the first multi-memory die has (i) a first surface and (ii) a second surface that is opposite to the first surface, wherein the semiconductor die is mounted on the first surface of the first multi-memory die, wherein the second multi-memory die is mounted on the second surface of the second multi-memory die, and wherein the method further comprises:
attaching a substrate to the first surface of the first multi-memory die.

15. The method of claim 14, wherein the substrate has an opening through which the semiconductor die is mounted on the first surface of the first multi-memory die.

16. The method of claim 14, wherein the semiconductor die is coupled to the substrate via a wire bonding process.

17. The method of claim 1, wherein the semiconductor is electrically coupled to at least the first memory die and the second memory die.

18. A method comprising:
providing a multi-memory die that comprises multiple individual memory dies, wherein
each of the individual memory dies is defined as an individual memory die within a wafer of semiconductor material during production of memory dies, and the multi-memory die is created by singulating the wafer of semiconductor material into memory dies where at least one of the memory dies is a multi-memory die that includes at least a first memory die and a second memory die that are still physically connected together; and coupling a semiconductor die to the multi-memory die, wherein the semiconductor die is coupled to the multi-memory die via an adhesive such that the semiconductor die is located between input/output pads located on two of the individual memory dies.

19. The method of claim 18, wherein coupling the semiconductor die to the multi-memory die further comprises:
coupling the semiconductor die to the multi-memory die via a wire bonding process that couples the semiconductor die to input/output pads located on two of the individual memory dies.

20. A method comprising:
providing a multi-memory die that comprises multiple individual memory dies, wherein
each of the individual memory dies is defined as an individual memory die within a wafer of semiconductor material during production of memory dies, and
the multi-memory die is created by singulating the wafer of semiconductor material into memory dies where at least one of the memory dies is a multi-memory die that includes at least a first memory die and a second memory die that are still physically connected together;
coupling a semiconductor die to the multi-memory die; and
coupling the multi-memory die to a substrate via one of (i) a flip chip process or (ii) a wire bonding process.

* * * * *